United States Patent
Bhatia

(10) Patent No.: US 7,613,969 B2
(45) Date of Patent: Nov. 3, 2009

(54) METHOD AND SYSTEM FOR CLOCK SKEW INDEPENDENT SCAN REGISTER CHAINS

(75) Inventor: Sandeep Bhatia, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 11/081,315

(22) Filed: Mar. 16, 2005

(65) Prior Publication Data

US 2006/0095819 A1    May 4, 2006

Related U.S. Application Data

(60) Provisional application No. 60/623,464, filed on Oct. 29, 2004.

(51) Int. Cl.
*G01R 31/28* (2006.01)
*H03K 3/289* (2006.01)

(52) U.S. Cl. .............. 714/729; 714/726; 714/731; 327/202

(58) Field of Classification Search ............... 714/726, 714/729, 731; 327/202
See application file for complete search history.

(56) References Cited

U.S. PATENT DOCUMENTS

| 6,060,924 A | 5/2000 | Sugano | 327/202 |
| 6,806,731 B2* | 10/2004 | Kohno | 326/38 |
| 7,038,494 B2* | 5/2006 | Morton | 326/93 |
| 2005/0005214 A1* | 1/2005 | Ueda | 714/726 |

OTHER PUBLICATIONS

Digital Systems Testing and Testable Design; Copyright 1990; IEEE; Miron Abramovici, Melvin Breuer and Arthur Friedman; pp. 364-381.

* cited by examiner

Primary Examiner—John J Tabone, Jr.
(74) Attorney, Agent, or Firm—Orrick, Herrington & Sutcliffe LLP

(57) ABSTRACT

A method and system for clock skew independent scan chains. In one embodiment, a method comprises connecting a plurality of mux-D scan registers in a chain configuration, wherein a first mux-D scan register of the plurality is associated with a first clock network, and a second mux-D scan register of the plurality is associated with a second clock network. The plurality of mux-D scan registers have a scan mode. The first mux-D scan register and the second mux-D scan register become clock skew independent by controlling a scan-enable signal and a clock signal.

14 Claims, 9 Drawing Sheets

METHOD AND SYSTEM FOR CLOCK SKEW INDEPENDENT SCAN REGISTER CHAINS

The present application claims the benefit of and priority to U.S. Provisional Patent Application No. 60/623,464 entitled "Clock skew independent Muxed-D scan register design" and filed on Oct. 29, 2004, and is hereby, incorporated by reference.

FIELD OF THE INVENTION

The field of the invention relates generally to hardware and software verification of logic circuits and more particularly relates to a method and system for clock skew independent scan register chains.

BACKGROUND OF THE INVENTION

The use of scan registers is a common design methodology for digital circuits that simplifies testing of manufactured integrated circuit (IC) semiconductor chips. Particularly, when a plurality of flip flops are used for a counter, a register or a like element on a semiconductor chip—a test for confirmation of operation of the flip flops themselves must be performed. Since a test of each flip flop requires a large circuit scale by a test circuit, a plurality of flip flops are combined to form a shift register for testing and a shifting operation of the shift register is confirmed to effect a test of the component flip flops. Generally, in a semiconductor integrated circuit formed on a semiconductor chip, from the point of view of design efficiency, basic circuits such as flip flops which compose the circuit are registered as cells in a library and layout design is performed by reference to the cells in the library. Traditionally, the cells of flip flops are divided into cells of the LSSD type and cells of the mux-D type, among other things.

Traditionally, the cells of flip flops are divided into cells of the LSSD type and cells of the mux-D type. IBM developed several full serial integrated scan architectures, referred to as Level-Sensitive Scan Design (LSSD). FIG. 1 illustrates a block diagram of a prior art LSSD design that uses a polarity-hold, hazard-free, and level-sensitive latch. When a clock is enabled, the state of a latch is sensitive to the level of the corresponding data input. To obtain race-free operation, clocks C and B as well as A and B are nonoverlapping.

A cell of a flip flop of the LSSD type includes a first selector for selecting one of a system clock and a first clock (A clock) in response to a selection signal, an inverter for inverting the system clock, a second selector for selecting one of an output signal of the inverter and a second clock (B clock) in response to the selection signal, a third selector for selecting one of a data signal and a scanning signal in response to the selection signal, a first latch circuit formed from a transmission gate or a like element for inputting an output of the fist selector as a clock and latching an output signal of the third selector at a rising edge of the clock, and a second latch circuit formed from a transmission gate or a like element for inputting an output of the second selector as a clock and latching an output of the first latch circuit.

Further, an output of the flip flop of the LSSD type is inputted as a scanning signal to another flip flop in the following stage while the system clock, A clock, and B clock are inputted commonly to construct a large shift register composed of several shift registers. A scanning signal is inputted from the outside to the top one of the flip flops of the shift register to form the large shift register.

FIG. 2 illustrates a block diagram of a prior art mux-D cell. A cell of the mux-D type includes an inverter for inverting a system clock in response to a selection signal, a first selector (e.g., scan-enable) for selecting one of a data signal and a scanning signal in response to the selection signal, and a second latch circuit formed from a transmission gate or a like element for inputting the system clock as a clock and latching an output signal of the first selector at a rising edge of the clock. Further, an output of the flip flop of the mux-D type is inputted as a scanning signal to another flip flop in the following stage while the system clock is inputted commonly to construct a shift register. A scan-enable signal is inputted from the outside to the top of the flip flops of the shift register to form a register. Mux-D scan registers are a popular scan style that uses a shift-enabled control signal to configure scan registers into one or more scan chains during scan-mode. Any desired test vector can be shifted-in in scan-mode, and the values stored in the scan registers are shifted out from the other end of the scan chain.

Where flip flops of the mux-D type are used, while there is an advantage that the circuit scale is smaller than that where flip flops of the LSSD type are used, there is a drawback. Because the system clock is also used for the scan operation, and different flip-flops may have different system clock signals that may experience timing skew that can corrupt the shifting process.

SUMMARY

A method and system for clock skew independent scan chains is disclosed. In one embodiment, a method comprises connecting a plurality of mux-D scan registers in a chain configuration, wherein a first mux-D scan register of the plurality is associated with a first clock network, and a second mux-D scan register of the plurality is associated with a second clock network. The plurality of mux-D scan registers have a scan mode. The first mux-D scan register and the second mux-D scan register become independent of clock skew by controlling a scan-enable signal and a clock signal.

The above and other preferred features of the invention, including various novel details of implementation and combination of elements, will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

DETAILED DESCRIPTION

Figure 1:
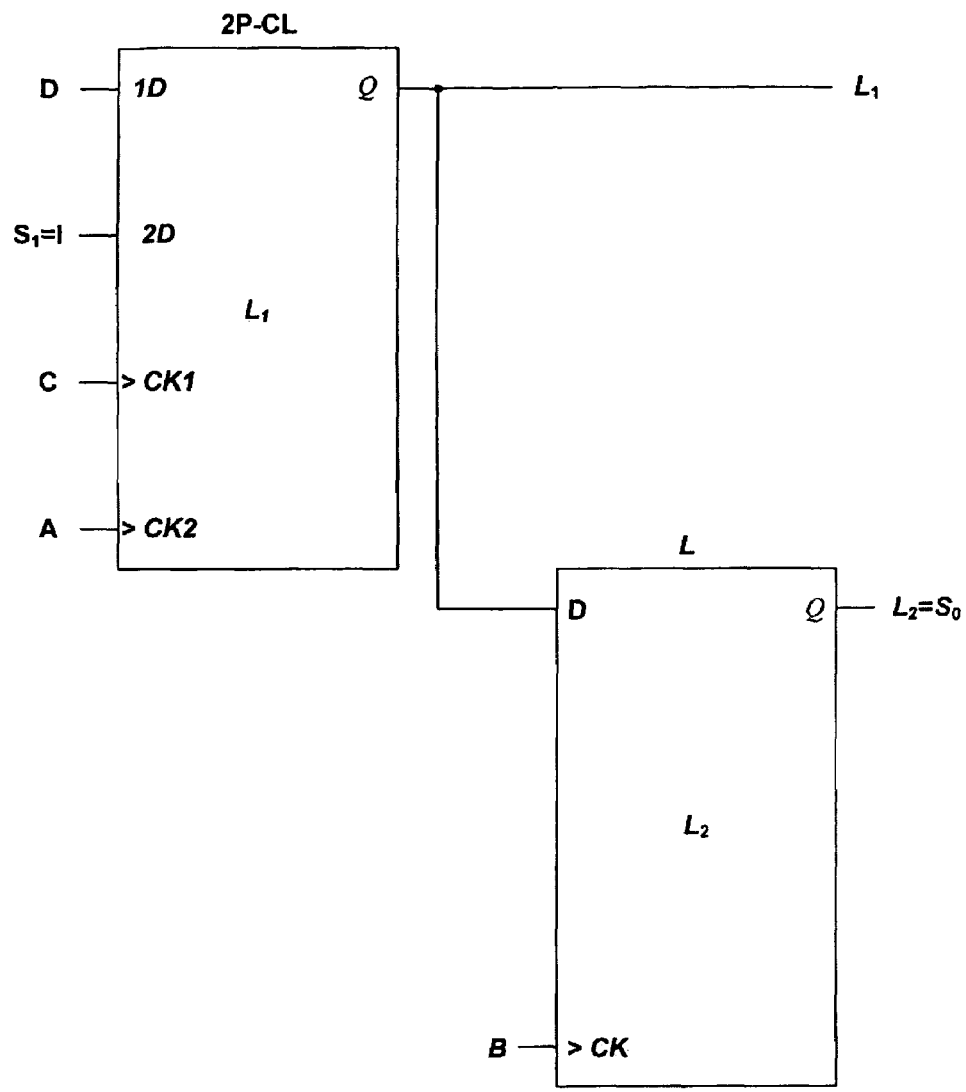
FIG. 1 illustrates a block diagram of a prior art LSSD design that uses a polarity-hold, hazard-free, and level-sensitive latch, according to one embodiment of the present invention.

A method and system for clock skew independent scan chains are disclosed. In one embodiment, a method comprises connecting a plurality of mux-D scan registers in a chain configuration, wherein a first mux-D scan register of the plurality is associated with a first clock network, and a second mux-D scan register of the plurality is associated with a second clock network. The plurality of mux-D scan registers have a scan mode. The first mux-D scan register and the second mux-D scan register are made independent of clock skew by controlling a scan-enable signal and a clock signal.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. It will be appreciated that a variety of programming languages may be used to implement the teachings of the invention as described herein.

Figure 3:
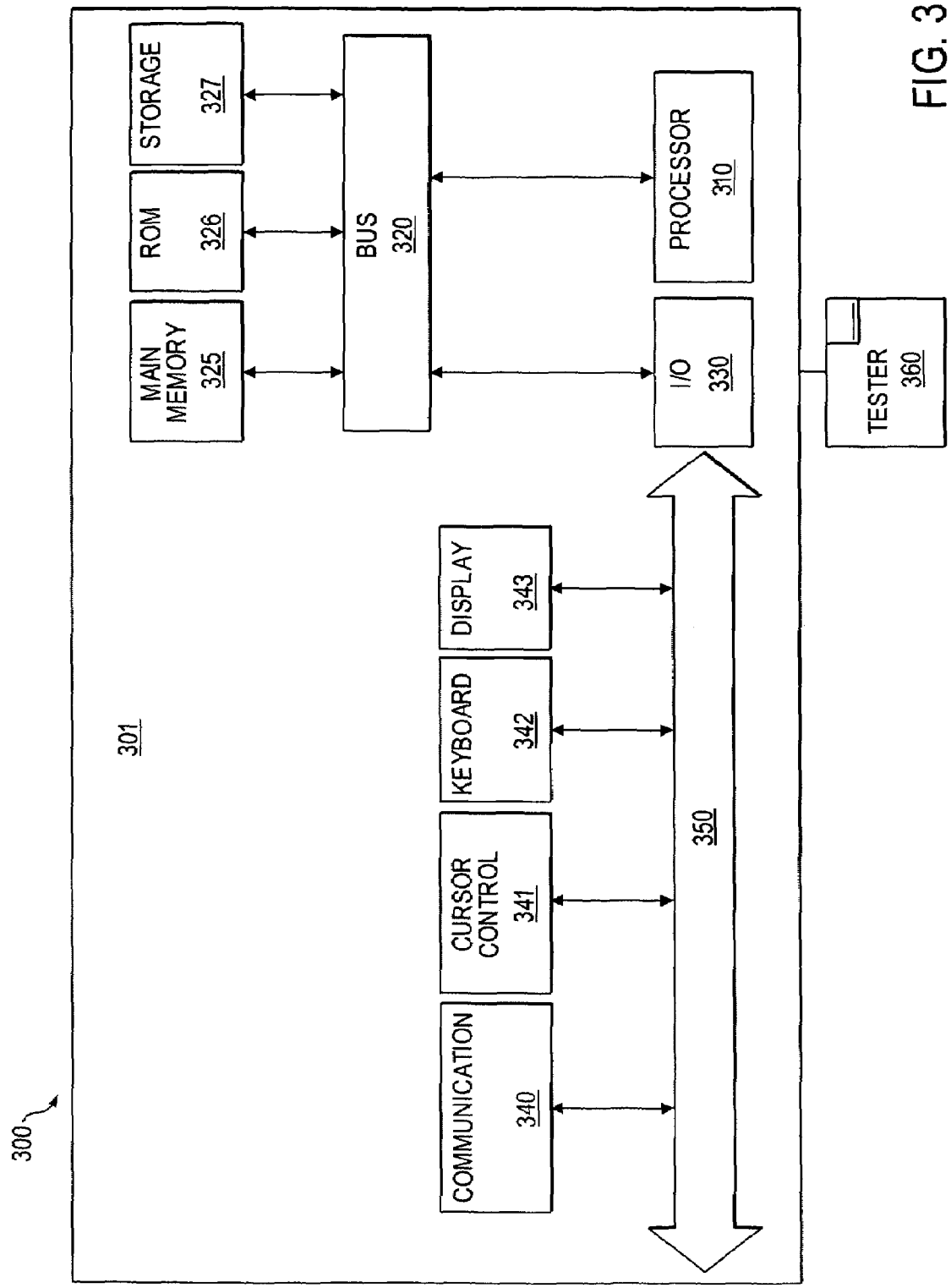
FIG. 3 illustrates a block diagram of an exemplary computer system, according to one embodiment of the present invention.

Turning to the figures, the presently preferred apparatus and methods of the present teachings will now be described. FIG. 3 illustrates a block diagram of an exemplary computer system, according to one embodiment of the present invention. A workstation 300 has a central processing unit ("CPU") 310 which can execute computer instructions, including instructions forming a software simulation program.

One embodiment of workstation 300 comprises a system bus 320 for communicating information, and a processor 310 coupled to bus 320 for processing information. Workstation 300 further comprises a random access memory (RAM) or other dynamic storage device 325 (referred to herein as main memory), coupled to bus 320 for storing information and instructions to be executed by processor 310. Main memory 325 also may be used for storing temporary variables or other intermediate information during execution of instructions by processor 310. Workstation 300 also may include a read only memory (ROM) and/or other static storage device 326 coupled to bus 320 for storing static information and instructions used by processor 310.

A data storage device 327 such as a magnetic disk or optical disc and its corresponding drive may also be coupled to computer system 300 for storing information and instructions. Computer system 300 can also be coupled to a second I/O bus 150 via an I/O interface 330. A plurality of I/O devices may be coupled to I/O bus 350, including a display device 343, an input device (e.g., an alphanumeric input device 342 and/or a cursor control device 141). For example, web pages and business related information may be presented to the user on the display device 343.

The communication device 340 is for accessing other computers (servers or clients) via a network. The communication device 340 may comprise a modem, a network interface card, or other well known interface device, such as those used for coupling to Ethernet, token ring, or other types of networks.

The workstation can be any type of computing device including a personal computer, etc. Tester system 360 works with workstation 300 to test manufactured semiconductor chip. Additionally, workstation 300 can be used during the design phase of an integrated circuit to place the present scan register design into the integrated circuit. Thus, the present scan register design is stored in a cell library for use by circuit designers. The cell library can be stored in main memory 325, ROM 326, storage 327, or in an external database accessed through I/O 330, according to one embodiment.

To minimize scan wire lengths, scan registers are arranged in a chain such that two closely placed scan registers are ordered next to each other in a chain. However, in certain cases—the two registers placed close to each other may have excessive clock skew (timing error) as they may belong to different clock domains. Additionally, two registers in a chain may belong to different parts of a clock tree even when belonging to the same clock domain. This can result in a data-hold violation when shifting scan vectors. Ultimately, the scan chains do not operate correctly because of this clock skew.

Figure 2:
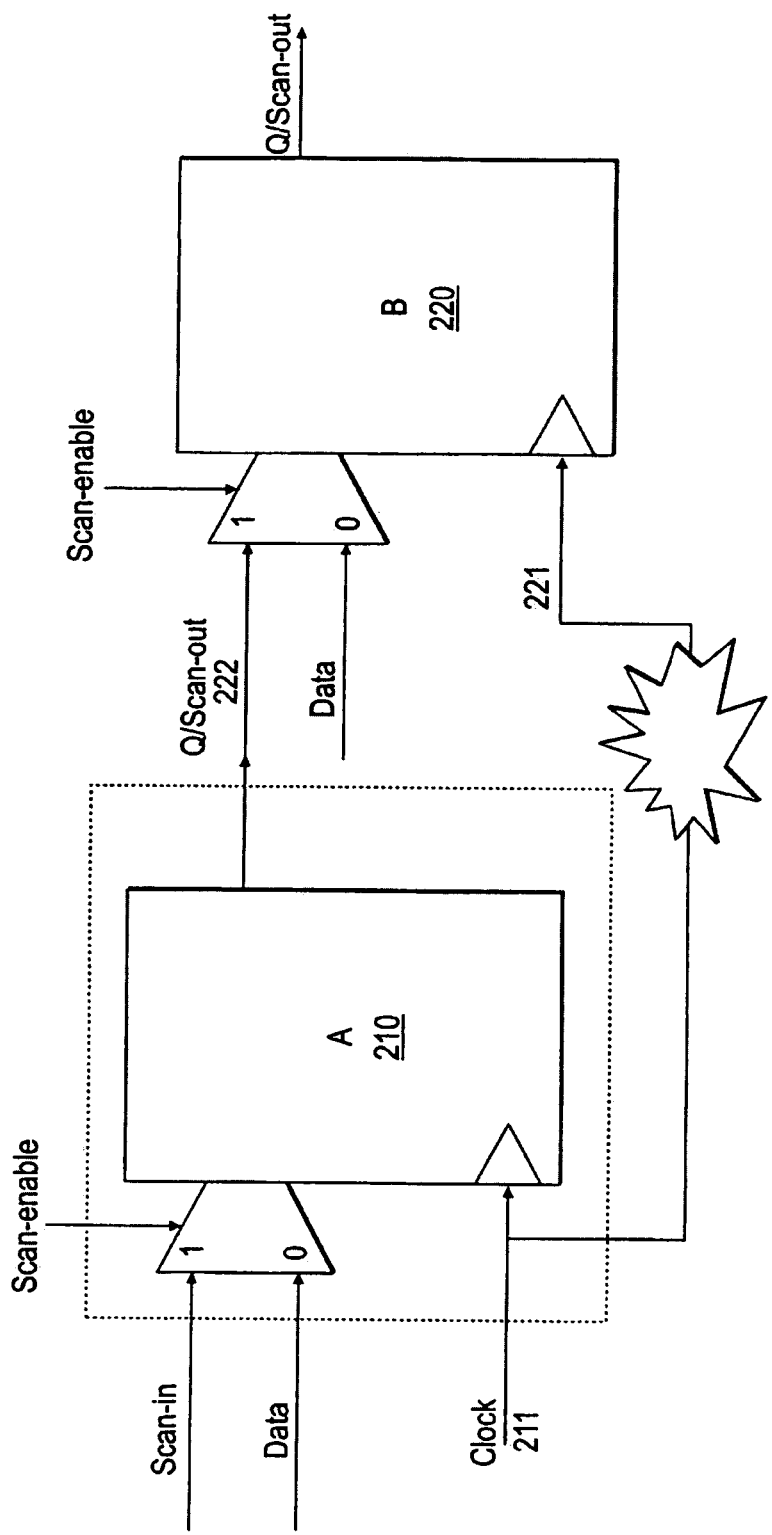
FIG. 2 illustrates a block diagram of a prior art mux-D cell, according to one embodiment of the present invention.

For example, returning to FIG. 2, consider register 210 and register 220 connected in a scan chain. The clock path 221 to register 220 has excessive delay as compared to the clock path 211 of register 210. When the clock edge arrives at register 210, its output changes and the data change is propagated to the scan-input 222 of register 220 before the corresponding clock edge appears at the clock pin of clock path 221 of register 220, causing incorrect data to be captured into register 220.

Figure 4:
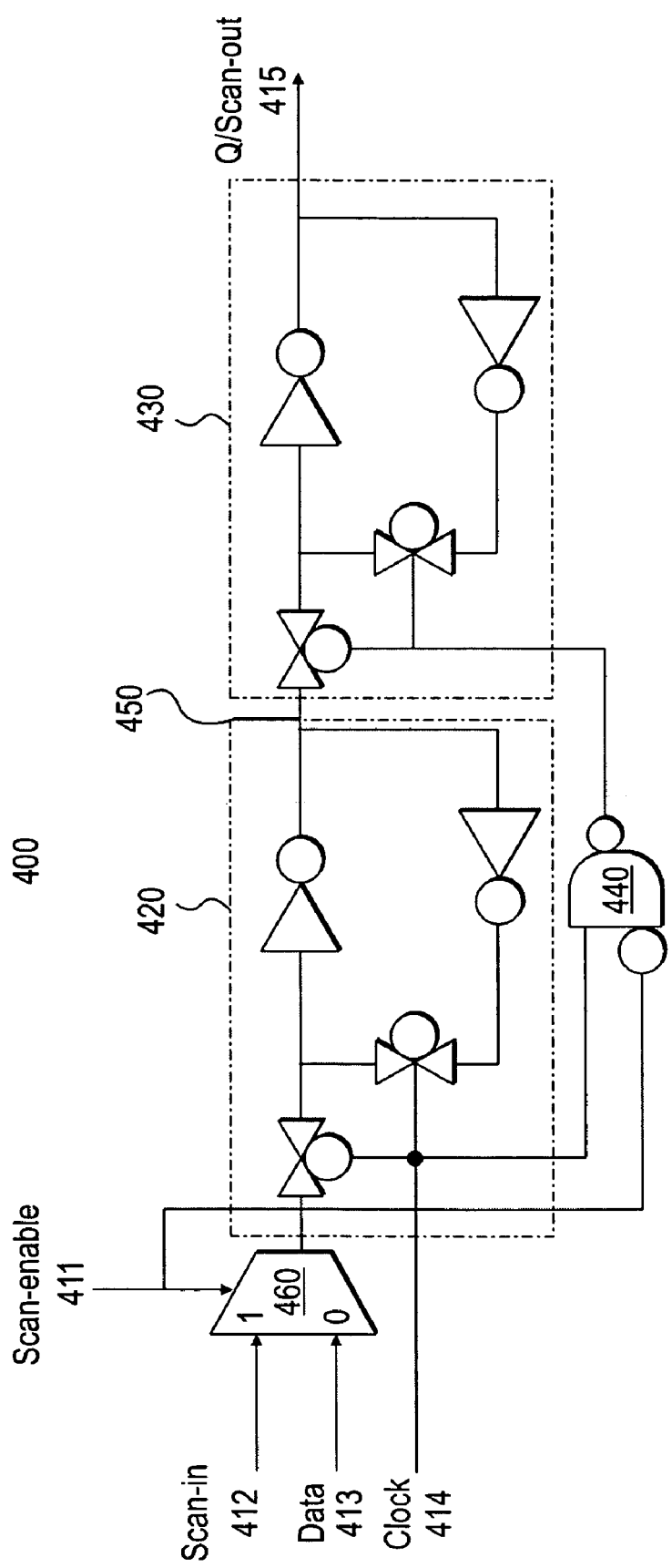
FIG. 4 illustrates a block diagram of an exemplary scan register with clock skew independence, according to one embodiment of the present invention.

FIG. 4 illustrates a block diagram of an exemplary scan register with clock skew independence 400, according to one embodiment of the present invention. Scan register 400 is a mux-D scan register that has a clock input 414, functional data input 413, scan data input 412, and a scan-enable signal 411. The active edge on the clock input 414 latches the data from the functional input 413 or scan-input 412, based on the value of the scan-enable signal 411, into the master latch 420. Master latch output 450 is the scan-in input and functional data input of slave latch 430.

Scan register 400 is a rising edge triggered scan register. Register 400 includes two level-sensitive latches (one master and one slave), with a data-selector multiplexer (mux) 460 at the input to select between functional data-input 413 and scan-in input 412.

Scan register 400 gates the clock signal 414 to slave latch 430 using scan-enable 411. Thus, slave latch 430 becomes transparent only when the clock signal 414 is high and the scan-enable signal 411 is low. In a normal data mode (when the scan-enable signal 411 stays low) there is no change in the operation of register 400. However, in scan-shift mode, the clock signal 414 and the scan enable signal 411 is pulsed to shift the scan-data through the register 400. In prior art mux-D scan registers, the scan-enable signal is held constant at its active state during the entire shift period.

Figure 5:
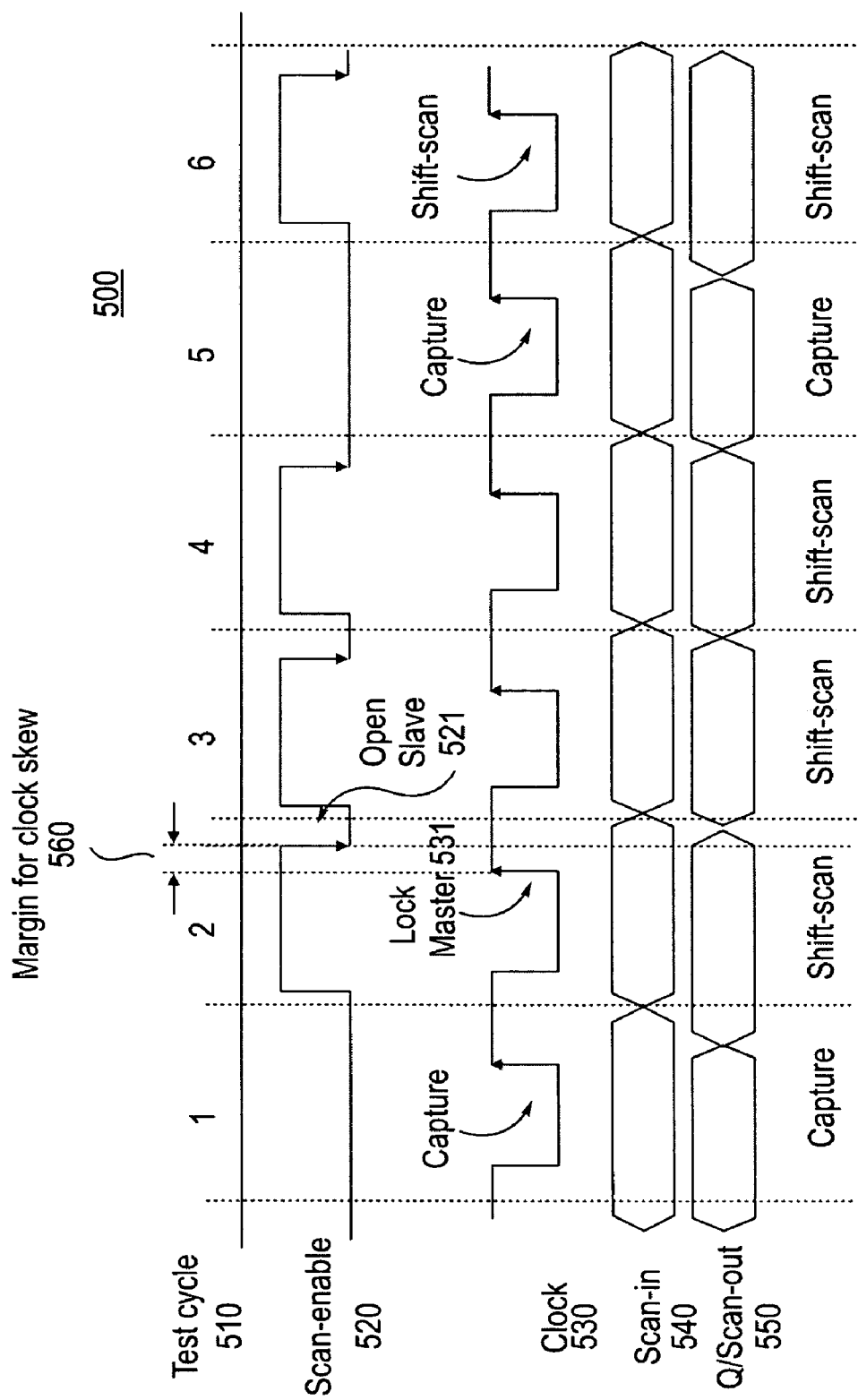
FIG. 5 illustrates timing diagram for an exemplary scan-register with clock skew independence, according to one embodiment of the present invention.

FIG. 5 illustrates timing diagram for an exemplary scan-register with clock skew independence, according to one embodiment of the present invention. Timing diagram 500 includes scan enable signal 520, clock signal 530, scan-in signal 540, and data/scan output signal 550. In "capture" cycle (test cycle 1), scan-enable 520 is asserted to logic 0 (e.g., its inactive value), and system clock 530 is pulsed. This captures the next state data into register 400. Next, in "shift scan" cycle (test cycle 2), scan-enable 520 is asserted to logic 1 and the clock signal 530 is pulsed. This locks the scan data into master latch 420 of scan register 400.

However, to propagate the scan data to the output of the master latch 420, the scan-enable signal 520 is pulsed to logic 0, at the end of test cycle 2. The time difference between the active (rising) edge 531 on clock 530 and the falling edge 521 on the scan enable signal 520 is controlled by the tester 360 to allow for the system clock 530 to be propagated to slave latch 430 (or subsequent latches in a scan-chain). The scan-enable signal 520 is controlled to allow for the maximum clock skew margin 560 between the master latch 420 and slave latch 430. For longer scan chains the maximum margin for clock skew is taken for any latch in the scan chain.

In alternate embodiments, the signals in timing diagram 500 can be slowed down to allow for any realistic clock skew in the design. Thus, in scan-shift mode, register 400 is independent of clock skew. Scan enable signal 520 is left at logic 0 for the capture cycle (test cycle 5).

Figure 6:
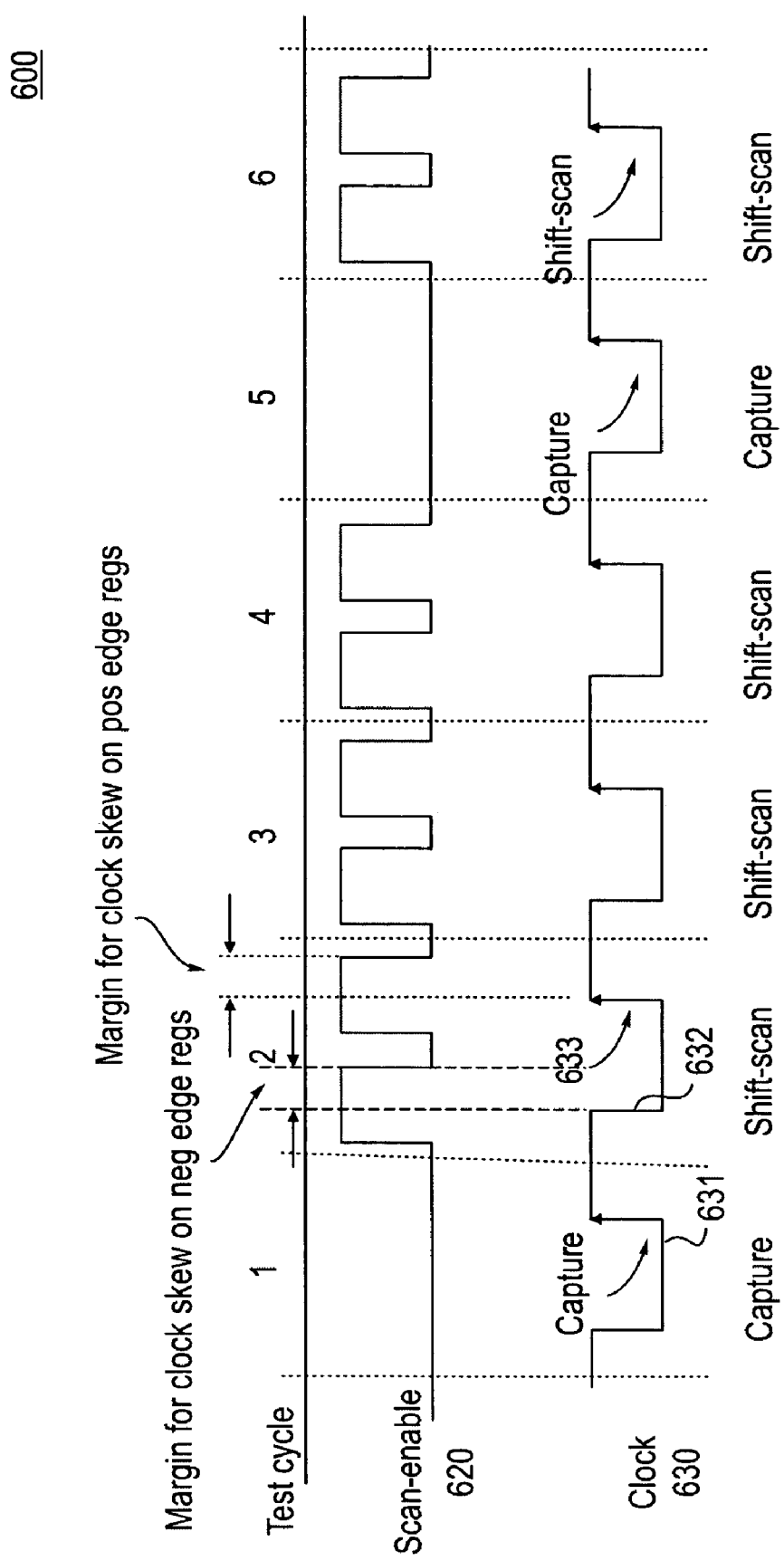
FIG. 6 illustrates a timing diagram for an exemplary scan register with clock skew independence when mixing positive and negative edge triggered latches, according to one embodiments of the present invention.

FIG. 6 illustrates a timing diagram for an exemplary scan register with clock skew independence when mixing positive and negative edge triggered latches, according to one embodiments of the present invention. If a circuit design mixes both positive edge triggered, and negative edge triggered registers, then scan enable signal 620 is pulsed twice in each shift cycle—once after the falling edge 632 of the clock 630, and once after the rising edge 633 of clock 630.

In shift scan mode, the scan-enable is activated by setting scan-enable signal 620 to logic 1. On the falling edge of clock signal 630, the mater latch of negative-edge triggered registers lock in the scan data. Scan enable 620 is then pulsed down to transfer the data into the slave latches of those registers. Scan-enable 620 is then raised back to logic 1. Next, a rising edge on clock signal 630 locks in the scan data into master latches of positive-edge triggered registers. Scan-enable 620 is pulsed down to transfer this data into the slave latches of positive-edge triggered registers. Thus, scan enable provides a delay in transfer of data from master latch to slave latch of each register. This allows for properly shifting test data in scan-shift mode under any clock skew that may be present along the chain. In some embodiments when testers 360 only allow one pulse per pin during testing, each shift cycle may be split into two tester cycles.

Figure 7:
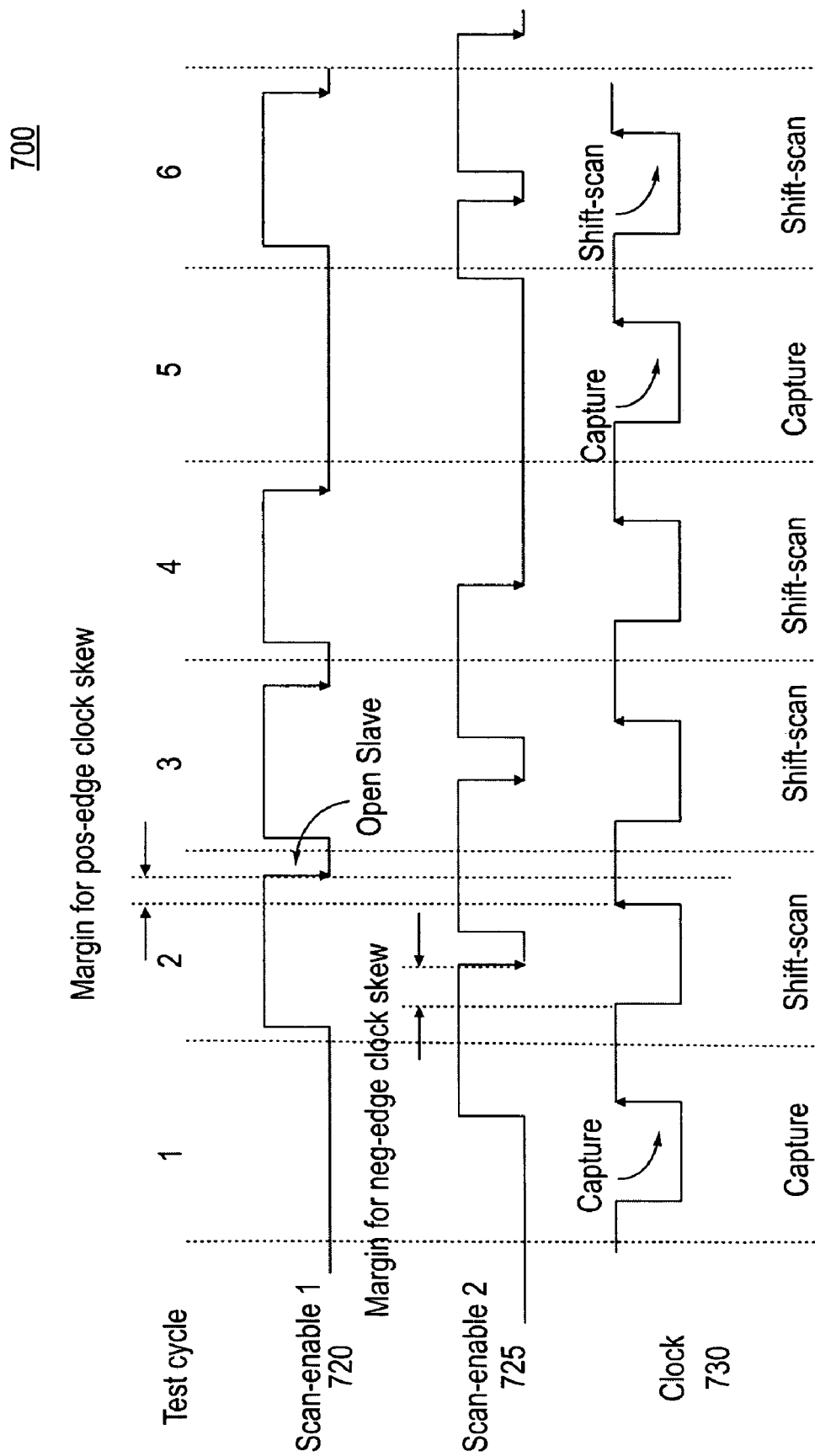
FIG. 7 illustrates a timing diagram for a scan register with clock skew independence using two different scan enable signals for different clock domains, according to one embodiment of the present invention.

FIG. 7 illustrates a timing diagram for a scan register with clock skew independence using two different scan enable signals for different clock domains, according to one embodiment of the present invention. Scan enable 1 signal 720 is used for positive edge triggered registers and scan enable 2 signal 725 is used for negative edge triggered registers.

Figure 8:
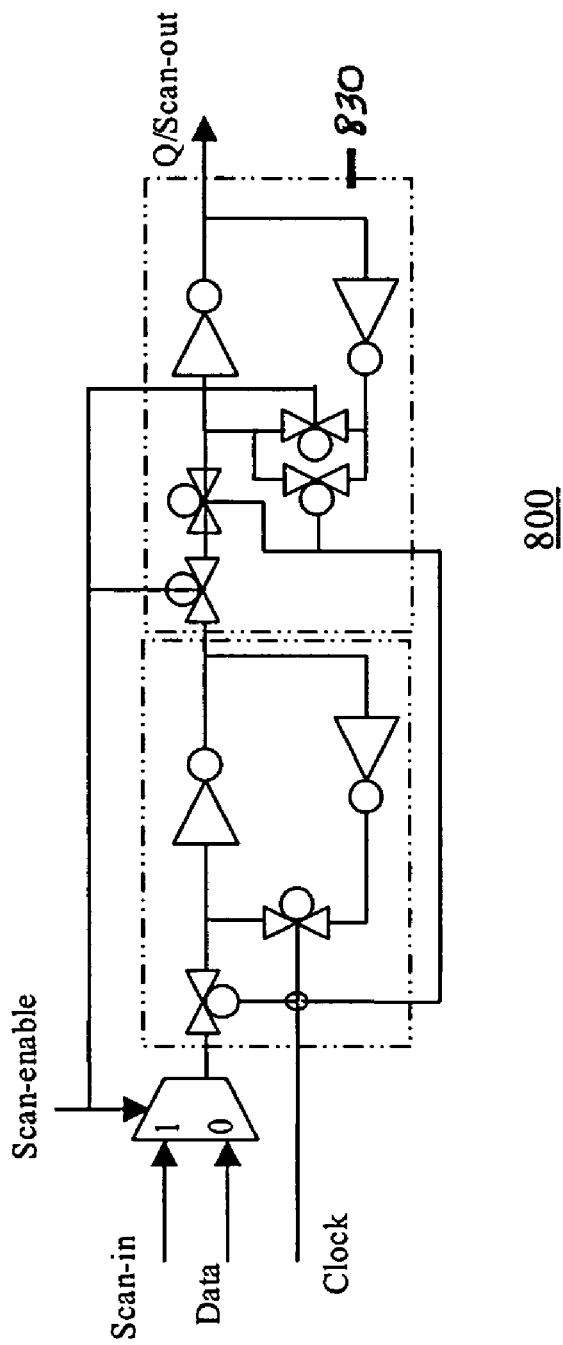
FIG. 8 illustrates a block diagram of an exemplary transistor level design of a mux-D scan register with clock skew independence, according to one embodiment of the present invention.

FIG. 8 illustrates a block diagram of an exemplary transistor level design of a mux-D scan register with clock skew independence, according to one embodiment of the present invention. Scan register 800 implements the logic gate 440 of FIG. 4 as additional transistors in slave latch 830. Scan register 800 operates similar to scan register 400 as described above.

The scan registers described above in conjunction with FIGS. 3-8 exhibit numerous advantages over prior scan registers. For example, there is no impact of clock skew when shifting scan data through scan chains—the correct scan data is latched. There is no need to add extra buffers, latches, or delay buffers on the scan path to compensate for clock skew at the registers in a chain. The performance impact of the present scan registers is similar to that of conventional mux-D scan registers.

The number of test control signals and test architecture remains identical to that of conventional mux-D scan registers, whereas, LSSD require additional test control signals. The structure of the present scan register only adds two additional transmission gates to the slave latch, as compared to prior mux-D registers. Thus, the area of the present scan register on a chip is marginally increased over prior mux-D scan registers. There is no change or effect on the master/slave latch operations during the normal operation mode of the present scan register.

The present scan register provides these advantages by reusing the scan-enable signal to delay data change at a slave latch during a scan shift operation. Additionally, the scan enable and clock signals are pulsed in shift mode to create any arbitrary delay that compensates for clock skew along the scan chain.

Figure 9:
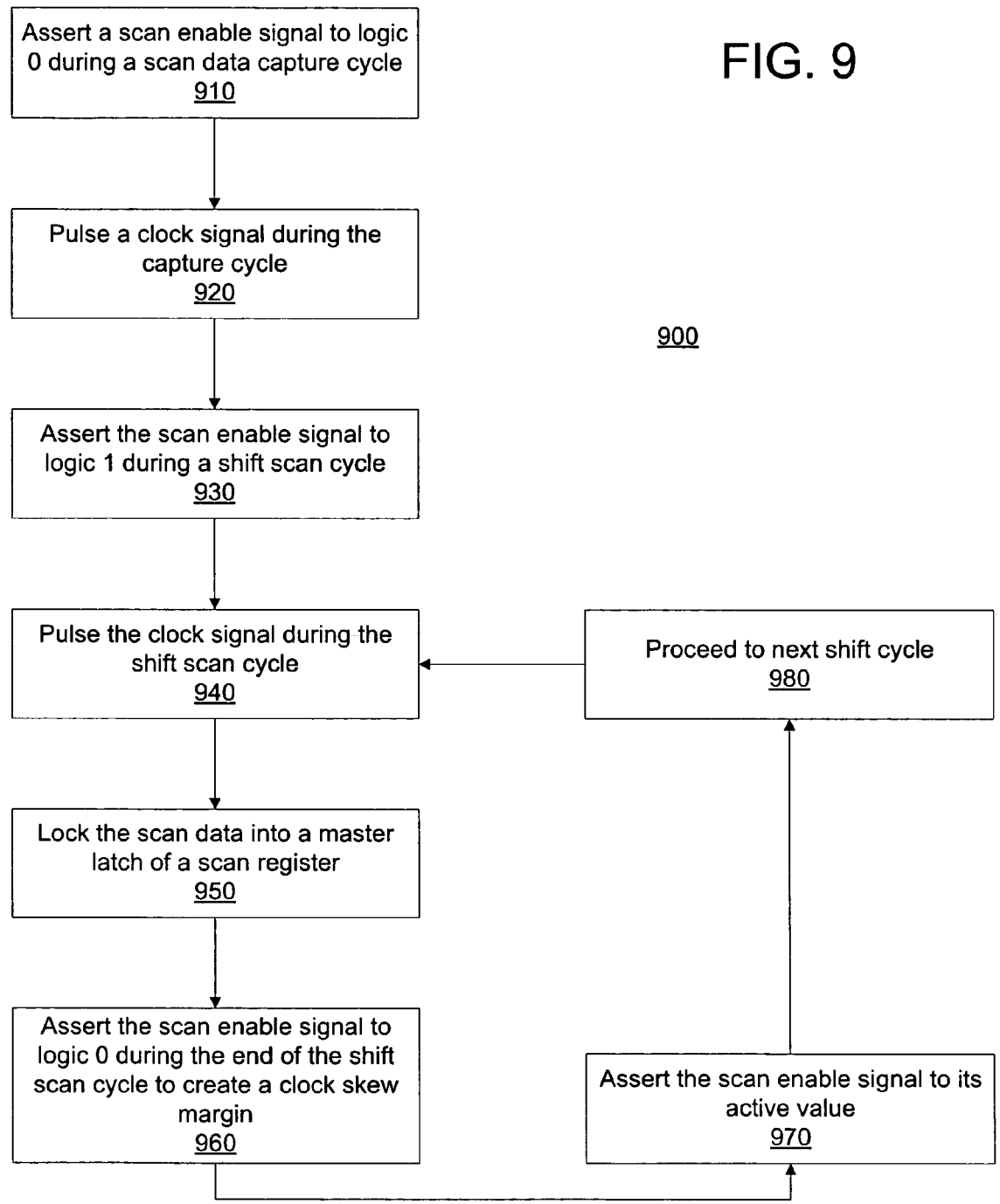
FIG. 9 illustrates a flow chart for an exemplary process for providing a scan chain that is independent of clock skew, according to one embodiment of the present invention.

FIG. 9 illustrates a flow chart for an exemplary process for a clock skew independent scan chain, according to one embodiment of the present invention. Scan enable signal 411 is asserted to its inactive value during a scan data capture cycle (910). Clock signal 414 is pulsed during the capture cycle (920). The scan enable signal 411 is asserted to logic 1 during a shift scan cycle (930). Clock signal 414 is pulsed during the shift scan cycle (940). The scan data is locked into master latch 420 of scan register 400 (950). The scan enable signal is asserted to its inactive value during the end of the shift scan cycle to generate a timing delay that corrects clock skew between master latch 420 and slave latch 430 (960). The scan enable signal is asserted to its active value (e.g., logic 1) (970), and the next shift cycle is processed (980).

A method and system for system for clock skew independent scan chains are disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

I claim:

1. A method, comprising:
operating a tester to assert a scan-enable signal;
asserting the scan enable signal to an inactive value during a scan data capture cycle, wherein the inactive value is equivalent to a logic low;
pulsing a clock signal during the capture cycle;
asserting the scan enable signal to an active value during a shift scan cycle, wherein the active value is equivalent to a logic high;
locking scan data into a first master latch of a negative-edge triggered scan register having the first master latch and a first slave latch when the clock signal has a falling edge;
asserting the scan enable signal to the inactive value;
transferring the scan data from the first master latch to the first slave latch to compensate for clock skew;
asserting the scan enable signal to the active value;
locking the scan data into a second master latch of a positive-edge triggered scan register having the second master latch and a second slave latch when the clock signal has a rising edge; and
asserting the scan enable signal to the inactive value; and
transferring the scan data from the second master latch to the second slave latch to compensate for clock skew.

2. A method, comprising:
operating a negative-edge triggered mux-D scan register in scan mode;
operating a tester to assert a scan-enable signal;
gating a clock signal to a first slave latch of the negative-edge triggered mux-D scan register having a first master latch and the first slave latch using the scan-enable signal;
asserting the scan-enable signal to an active value during the scan mode, wherein the active value is equivalent to a logic high;
locking scan data into the first master latch of the negative-edge triggered mux-D scan register when the clock signal has a falling edge;
asserting the scan enable signal to an inactive value, wherein the inactive value is equivalent to a logic low;
transferring the scan data from the first master latch to the first slave latch;
asserting the scan enable signal to the active value;
locking the scan data into a second master latch of a positive-edge triggered scan register having the second master latch and a second slave latch when the clock signal has a rising edge; and
asserting the scan-enable signal to the inactive value; and
transferring the scan data from the second master latch to the second slave latch to compensate for clock skew.

3. A method, comprising:
operating a tester to assert a scan-enable signal;
operating a negative-edge triggered mux-D scan register in scan mode, the negative-edge triggered mux-D scan register having a first master latch and a first slave latch; including,
asserting the scan-enable signal to an active value, wherein the active value is equivalent to a logic high;
locking scan data into the first master latch of the negative-edge triggered mux-D scan register when a clock signal has a falling edge;
asserting the scan enable signal to the active value;
locking the scan data into a second master latch of a positive-edge triggered scan register having the second master latch and a second slave latch when the clock signal has a rising edge;
inverting the scan enable signal to generate an inverted scan enable signal;
logically ANDing the inverted scan enable signal with the clock signal, to generate a slave latch clock signal;
providing the slave latch clock signal to the first slave latch to transfer the scan data to the first slave latch;
asserting the scan enable signal to an inactive value, wherein the inactive value is equivalent to a logic low; and
transferring the scan data from the second master latch to the second slave latch.

4. A method, comprising:
operating a multiplexer including a scan-in input, a data input, and a scan-enable input;
connecting a first master latch to the multiplexer, the first master latch locking scan data into the first master latch of a negative-edge, triggered sc an register having the first master latch and a first slave latch when a clock signal has a falling edge;
transferring the scan data from the first master latch to the first slave latch;
locking the scan data into a second master latch of a positive-edge triggered scan register having the second master latch and a second slave latch when the clock signal has a rising edge;
and
connecting a logic gate to the clock signal and to the first slave latch using a scan-enable signal provided to the scan-enable input.

5. The method of claim 4, further comprising connecting a NAND gate to the clock signal and to the first slave latch, and the logic gate using the master clock signal and the scan-enable signal inverted.

6. The method of claim 4, further comprising implementing the logic gate within the first slave latch with one or more transmission gates.

7. The method of claim 6, wherein the first slave latch further comprises a second scan-enable input.

8. A method, comprising:
operating a tester to assert a scan-enable signal;
asserting the scan enable signal to an inactive value during a scan data capture cycle, wherein the inactive value is equivalent to a logic low;
pulsing a clock signal during the capture cycle;
asserting the scan enable signal to an active value during a shift scan cycled, wherein the active value is equivalent to a logic high;
locking scan data into a first master latch of a positive-edge triggered scan register having the first master latch and a first slave latch when the clock signal has a rising edge;
asserting the scan enable signal to the inactive value;
transferring the scan data from the first master latch to the first slave latch to compensate for clock skew;
asserting the scan enable signal to the active value;
locking the scan data into a second master latch of a negative-edge triggered scan register having the second master latch and a second slave latch when the clock signal has a falling edge; and
asserting the scan enable signal to the inactive value; and
transferring the scan data from the second master latch to the second slave latch to compensate for clock skew.

9. A method, comprising:
operating a tester to assert a scan-enable signal;
operating a positive-edge triggered mux-D scan register in scan mode;
gating a clock signal to a first slave latch of the positive-edge triggered mux-D scan register having a first master latch and the first slave latch using the scan-enable signal;
asserting the scan-enable signal to an active value during the scan mode, wherein the active value is equivalent to a logic high;
locking scan data into the first master latch of the positive-edge triggered mux-D scan register when the clock signal has a rising edge;
asserting the scan enable signal to an inactive value, wherein the inactive value is equivalent to a logic low;
transferring the scan data from the first master latch to the first slave latch;
asserting the scan enable signal to the active value;
locking the scan data into a second master latch of a negative-edge triggered scan register having the second master latch and a second slave latch when the clock signal has a falling edge; and
asserting the scan-enable signal to the inactive value;
transferring the scan data from the second master latch to the second slave latch to compensate for clock skew.

10. A method. comprising:
operating a tester to assert a scan-enable signal;
operating a positive-edge triggered mux-D scan register in scan mode, the positive-edge triggered mux-D scan register having a first master latch and a first slave latch; including,
asserting the scan-enable signal to an active value, wherein the active value is equivalent to a logic high;
locking scan data into the first master latch of the positive-edge triggered mux-D scan register when a clock signal has arising edge;
asserting the scan enable signal to the active value;
locking the scan data into a second master latch of a negative-edge triggered scan register having the second master latch and a second slave latch when the clock signal has a falling edge;
inverting the scan enable signal to generate an inverted scan enable signal;
logically ANDing the inverted scan enable signal with the clock signal, to generate a slave latch clock signal;
providing the slave latch clock signal to the first slave latch to transfer the scan data to the first slave latch;
asserting the scan enable signal to an inactive value, wherein the inactive value is equivalent to a logic low; and
transferring the scan data from the second master latch to the second slave latch.

11. A method, comprising:
operating a multiplexer including a scan-in input, a data input, and a scan-enable input;
connecting a first master latch to the multiplexer, the first master latch locking scan data into the first master latch of a positive-edge triggered scan register having the first master latch and a first slave latch when a clock signal has a rising edge;
transferring the scan data from the first master latch to the first slave latch;
locking the scan data into the second master latch of a negative-edge triggered scan register having the second master latch and a second slave latch when the clock signal has a falling edge;
and
connecting a logic gate to the clock signal and to the first slave latch using a scan-enable signal provided to the scan-enable input.

12. The method of claim 11, further comprising connecting a NAND gate to the clock signal and to the first slave latch, and the logic gate using the master clock signal and the scan-enable signal inverted.

13. The method of claim 11, further comprising implementing the logic gate within the first slave latch with one or more transmission gates.

14. The method of claim 13, wherein the first slave latch further comprises a second scan-enable input.

* * * * *

UNITED STATES PATENT AND TRADEMARK OFFICE
CERTIFICATE OF CORRECTION

PATENT NO.       : 7,613,969 B2  Page 1 of 1
APPLICATION NO. : 11/081315
DATED            : November 3, 2009
INVENTOR(S)      : Sandeep Bhatia It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 37 days.

Signed and Sealed this

Nineteenth Day of October, 2010

David J. Kappos
*Director of the United States Patent and Trademark Office*